United States Patent [19]

LaBrie

[11] 4,210,903
[45] * Jul. 1, 1980

[54] METHOD FOR PRODUCING ANALOG-TO-DIGITAL CONVERSIONS

[75] Inventor: Paul J. LaBrie, Salem, Mass.

[73] Assignee: Semiconductor Circuits, Inc., Haverhill, Mass.

[*] Notice: The portion of the term of this patent subsequent to Aug. 29, 1995, has been disclaimed.

[21] Appl. No.: 917,464

[22] Filed: Jun. 21, 1978

Related U.S. Application Data

[63] Continuation of Ser. No. 654,298, Feb. 2, 1976, Pat. No. 4,110,747.

[51] Int. Cl.² ............................................. H03K 13/02
[52] U.S. Cl. ........................ 340/347 NT; 340/347 M
[58] Field of Search .... 340/347 M, 347 NT, 347 AD; 324/99 D; 364/605, 733

[56] References Cited

U.S. PATENT DOCUMENTS

| | | | |
|---|---|---|---|
| 3,185,820 | 5/1965 | Williams et al. | 340/347 AD |
| 3,500,196 | 3/1970 | Cooper | 340/347 M X |
| 3,555,298 | 1/1971 | Neelands | 340/347 CC |
| 3,566,265 | 2/1971 | Reid | 340/347 CC |
| 3,654,560 | 4/1972 | Cath et al. | 340/347 CC |
| 3,710,376 | 1/1973 | Fluegel | 364/854 X |
| 4,031,533 | 6/1977 | Neumann | 340/347 M X |
| 4,034,364 | 7/1977 | Fukuda et al. | 340/347 NT |

Primary Examiner—Thomas J. Sloyan
Attorney, Agent, or Firm—Morse, Altman, Oates & Bello

[57] ABSTRACT

Analog signals are converted into digital form in a reproducible, accurate and stable manner. The tri-dual phase technique involves the conversion of the condition to be measured, and typically represented by a voltage, first to a reference level and then to an unknown level in a dual phase conversion, and then solving for the unknown level once the relationship of the reference level, the unknown high input level, and the unknown low input levels are established. A circuit capable of carrying out the technique includes an integrator receiving voltage input signals from a switching device adapted to switch to three different input signals, including a high unknown signal level, a low unknown signal level, and a known signal reference level. The reference level is also fed into a comparator which receives the output of the integrator. Calculating circuitry is provided for the output of the comparator for processing the output and presenting the results thereof in a digital display format or other digital output.

2 Claims, 6 Drawing Figures

METHOD FOR PRODUCING ANALOG-TO-DIGITAL CONVERSIONS

CROSS-REFERENCE TO RELATED APPLICATIONS

This is a continuation of application Ser. No. 654,298, filed on Feb. 2, 1976, now U.S. Pat. No. 4,110,747.

BACKGROUND OF THE INVENTION

1. Field of the Invention

This invention relates generally to analog-to-digital converters and analog-to-digital converting techniques, and more particularly is directed toward the new and improved method and associated circuitry for measuring an unknown quantity such as voltage, power, etc., by means of a tri-dual phase analog-to-digital technique.

2. Description of the Prior Art

A great many applications exist where an analog quantity or value must be measured accurately and presented in digital form. Various types of analog-to-digital converters are available and adapted to convert an analog value in the form of voltage, power, current, resistance, speed, strength, pressure, etc., into digital form. In electronic analog-to-digital converters two basic techniques are utilized. In one class the input quantity, usually voltage or current, is converted into another form, such as a pulse duration or a frequency. The intermediate quantity is then measured to provide a digital representation of the input signal. In the other class of A/D converters, the input is directly compared with a known reference signal which can be varied under control of the analog-to-digital converter logic.

Within these two classes many techniques are available for analog-to-digital conversion. The five major techniques most often used in data acquisition and process control computers are the ramp, the integrating-ramp, voltage-to-frequency, successive-approximation, and the parallel-serial methods. The first three of these methods involve the conversion of the input signal into an intermediate quantity, which is then measured; the latter two are direct comparison methods.

In the ramp A/D converter, the input voltage and a linear ramp voltage $V=Kt$, where K is the slope, are compared by using a comparator amplifier. Since the slope of the ramp is known, the time duration between a zero ramp voltage and equal input and ramp voltages is a measure of the magnitude of the input signal. This time duration is measured by counting constant-frequency pulses with a counter circuit.

In the integrating ramp A/D converter, the input signal is integrated for a fixed period of time. A constant reference voltage of opposite polarity is then integrated until the output of the integrator reaches zero. Since the duration of this second integration period is proportional to the magnitude of the input signal, a digital representation is obtained by measuring the length of this period using a counter and a constant frequency pulse source.

In the voltage-to-frequency technique, the input signal controls the frequency of a variable frequency oscillator. The average frequency of the oscillator over a fixed time interval can be measured using digital methods to obtain a digital representation of the input signal.

The successive approximation A/D converter is an example of a direct comparison conversion technique. The A/D converter consists of a digital-to-analog converter which is used as a digitally controlled voltage reference source, a comparator and control logic. The conversion consists of a sequence of comparisons between the input signal and reference voltage values derived from the D/A converter. The number of comparison steps required for a binary successive approximation A/D converter is equal to the number of bits in the digital representation.

The parallel serial technique is a modification of the successive approximation method and is used for high speed A/D converters. In this technique three or four bits of the digital output representation are determined simultaneously by using multiple comparators.

Although all of these A/D converters are used in data acquisition and process control computer systems, there are certain disadvantages present in each system, such as complexity, cost, accuracy, stability and reproducibility.

Accordingly, it is an object of the present invention to provide an improved method and associated circuitry for converting an analog value to a digital value on a highly reproducible, accurate and stable basis. Another object of this invention is to provide an A/D converter having a simplified analog portion for minimizing sources of potential errors.

SUMMARY OF THE INVENTION

This invention features a novel method and associated circuitry for converting an analog value in a tri-dual phase technique involving the making of three dual phase measurements to perform one conversion to a digital value. This method comprises the combining of each side of the unknown analog value with the known reference analog value, and each combination is converted into a number of counts that are directly proportional to an analog reference level. The known reference analog value is then converted into a number of counts that are also directly proportional to the analog reference level. Once converted, the relationship between the number of counts of each of the three conversions is solved for the difference in the analog value between each side of the unknown analog input. In one embodiment, the circuitry for producing the conversion includes a three-position switch adapted to connect sequentially to a reference level and to a pair of unknown input levels, one high and one low, an integrator connected to the switch, a comparator adapted to receive the output of the integrator as well as being connected to the reference level, and calculating circuitry, including a counter, register, computer and a digital output. In another embodiment, the same known and unknown signals are fed into a voltage-to-frequency converter having an output to a frequency counter operating a switch programmer and feeding to a register, a computer and a digital display.

DETAILED DESCRIPTION OF THE PREFERRED EMBODIMENTS

In an analog digital converter, an analog value, whether it be in the form of a voltage, current, resistance, etc., is converted into a digital value. In A/D converters heretofore available, the greatest source of potential error arises out of the analog portion of the converter, whether such converters or techniques are based on single slope, dual slope, successive approximation, etc. In the present method and circuit, sources of potential errors are minimized by simplifying the analog portion of the converter and conversion process.

By way of background information, if a signal of unknown level appearing at the input of a measuring system is chopped by the measuring system, and the energy contained in that unknown signal during the on state of the chopping circuit is integrated until the output level of the integrator reaches a known level, and that level is then detected in a comparator, then the value of the unknown signal may be expressed as follows:

$$A_L \alpha \Sigma a_L TN \quad (1)$$

Where:
$A_L$ is the level of the known signal,
$\alpha$ is the proportionality symbol,
$\Sigma$ is the summation symbol,
$a_L$ is the unknown signal level,
T is the width of the integrated pulse, and
N is the number of pulses.

Figure 1:
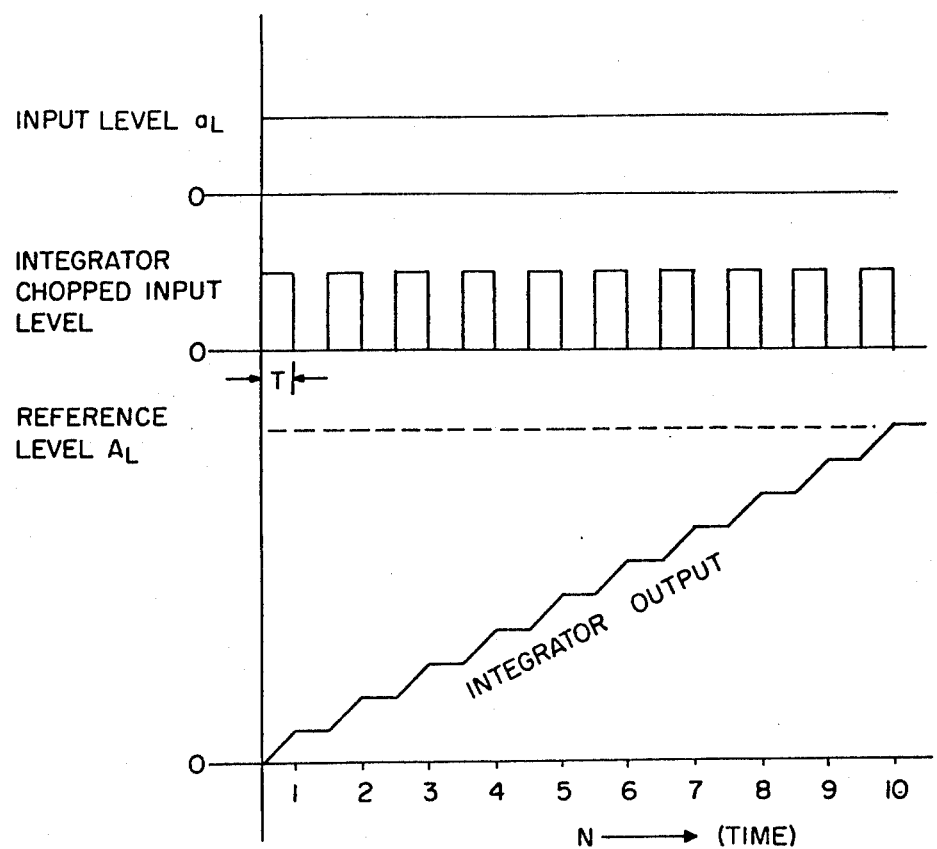
FIG. 1 is a graphical presentation of the input signals useful in explaining the invention.
Figure 2:
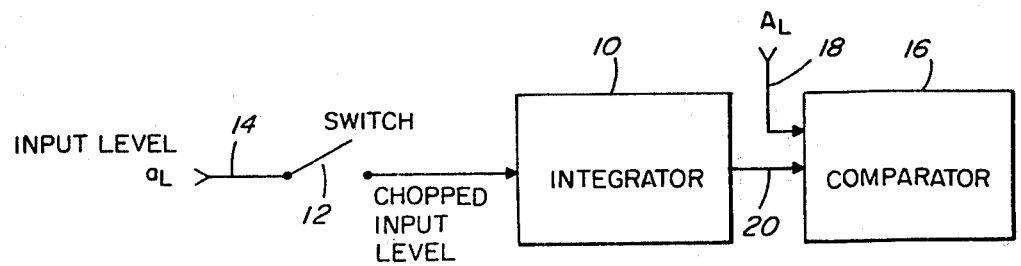
FIG. 2 is a block diagram of a simple signal integrating system.
Figure 3:
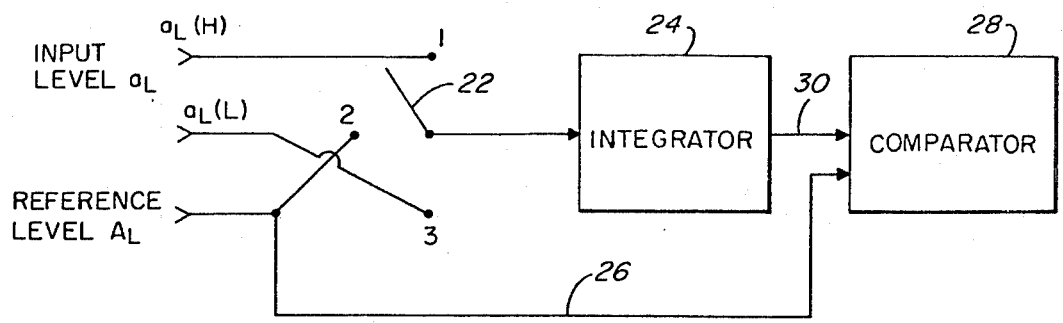
FIG. 3 is a block diagram of a circuit adapted to perform a conversion using sampling techniques.

Reference is made to FIGS. 1, 2 and 3 which show circuits and diagrams expressing the foregoing formula. In FIG. 2 an integrator 10 is connected by means of a switch 12 to an unknown signal appearing on an input lead 14. The output of the integrator 10 is to a comparator 16, which is connected by means of a lead 18 to a known input signal represented by the value $A_L$. In operating the circuit of FIG. 2, the switch 12 is opened and closed at some known rate and duty factor, so that the analog level of the unknown signal $a_L$ is chopped in the manner represented in FIG. 1. The chopped and integrated output is then fed by a lead 20 to the comparator 16 where it is compared to the level of the reference signal $A_L$. The process continues until the integrator output reaches the same level as the reference signal $A_L$. In similar fashion the technique known as single slope integration may be used to achieve the same result, if the reference signal $A_L$ is chopped and integrated, until the output of the integrator reaches the level of the unknown signal $a_L$. In such a circuit the relationship of the known to the unknown may be expressed as follows:

$$a_L \alpha \Sigma A_L TN \quad (2)$$

Both of the foregoing techniques present inherent disadvantages in that functioning circuits for carrying out these techniques are very expensive, particularly where it is desired to achieve accuracies of 0.1% over a normal operating temperature range, as well as over an extended period of time. This condition is due to inaccuracy of measurement based on the absolute values of all factors within the equation, including the linearity of the comparator, integrator off-set, variation in pulse width, variation in pulse repetition rate, integrator non-linearity, the changes in absolute values of all major components and other factors.

Another commonly used technique known as dual slope conversion is employed to minimize the effects of the absolute conditions by establishing a relative method of measurement, relating one set of numbers to another set of numbers on a ratio basis. This technique has been found to be satisfactory and is widely used but, like the single slope converter described above, requires a relatively sophisticated analog circuit in order to produce relative accuracy that is better than 0.05%.

Figure 4:
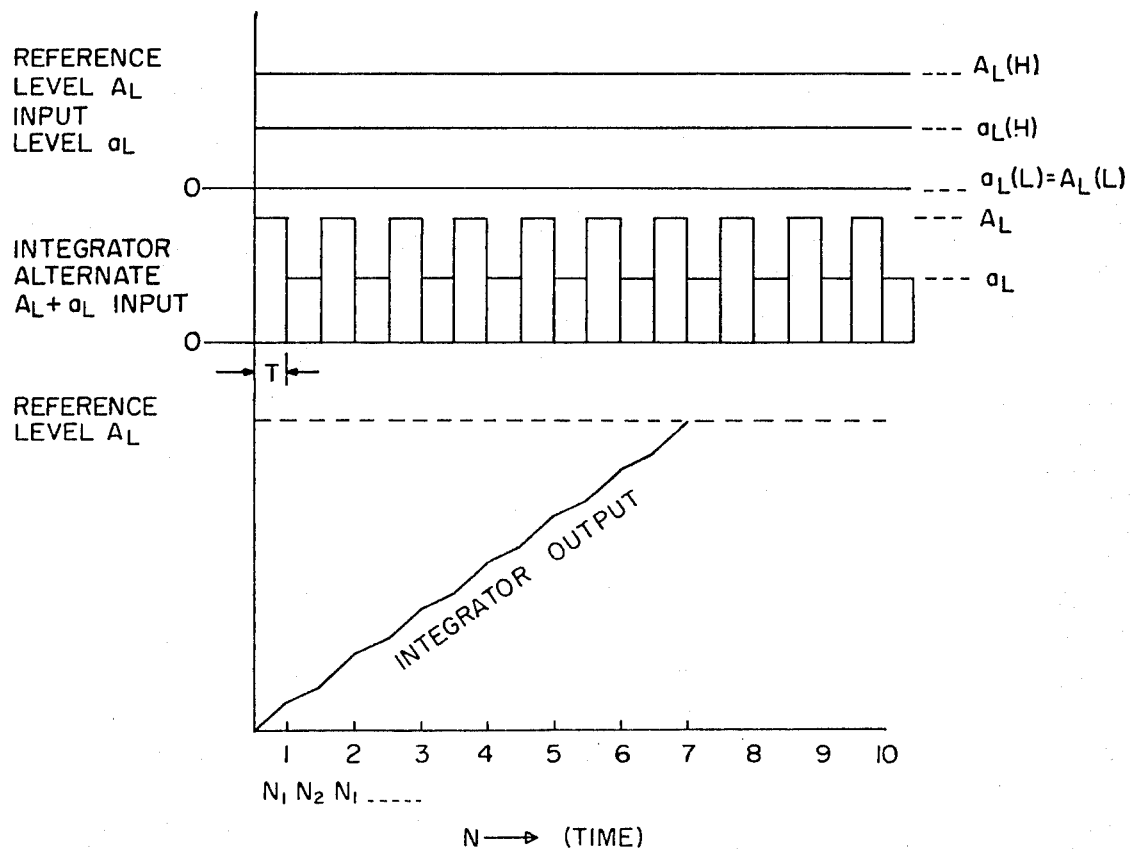
FIG. 4 is a graphic plot similar to FIG. 1, useful in explaining the operation of the circuit of FIG. 3.

The main advantage of the present invention is that it minimizes the sophistication of the analog circuitry by using it in such a manner that relative errors are eliminated as in the dual slope technique, and noise considerations are minimized by a sampling technique whereby the effect of the noise is reduced by the square root of the number of samples. This technique is commonly referred to as the calculation of average transients or CAT. The technique is demonstrated in the block diagram of FIG. 3 and the signal chart of FIG. 4. In FIG. 3, a three-position switch 22, which may be mechanical or preferably solid state electronic, is adapted to move into positions 1, 2 or 3 in order to provide a chopped signal to an integrator 24, representing in position 1 an unknown high input signal level $a_L(H)$; at position 2 a known reference level $A_L$; and in position 3 a low unknown signal level $a_L(L)$. The reference level $A_L$ is also connected by means of a lead 26 to a comparator 28, which also receives the output of the integrator 24 by means of a lead 30. If the switch 22 is switched alternately between position 2 connected to the known reference level and one of the unknown signal inputs, such as position 1, for the high input level $a_L(H)$, then the operation of the circuit may be expressed as follows:

$$a_L(H)\alpha\Sigma(a_L(H)N_1 + A_L N_2)T\alpha\Sigma(a_L(H) + A_L)N_H T \quad (3)$$

Where:
$N_H$ is the number of counts required to trip the comparator 28 when the integrator 24 integrates the combination of $a_L(H) + A_L$ for periods T,
$N_1$ is the number of times that $a_L(H)$ is integrated by the integrator 24 during the $N_H$ sampling cycle, and,
$N_2$ is the number of times that $A_L$ is integrated by the integrator 24 during the $N_H$ sampling cycle.

Similarly, if the switch 22 is switched alternately on just the known reference position $A_L$, position 2, then:

$$A_L \alpha \Sigma(A_L N_3 + A_L N'_3)T \, \alpha\Sigma(A_L + A_L)N_R T \quad (4)$$

Where:
$N_3$ and $N'_3$ are the number of times that $A_L$ is integrated by the integrator 24 during the $N_R$ sampling cycle, and,
$N_R$ is the number of counts required to trip the comparator 28 when the integrator 24 integrates the combinations of $A_L + A_L$ for periods T.

Also, if the switch 22 is switched alternately between position 3 for the low unknown signal level $a_L(L)$ and position 20 for the reference signal level $A_L$, then the result may be expressed as follows:

$$a_L(L)\alpha\Sigma(a_L(L)N_4 + A_L N_5)T\alpha\Sigma(a_L(L) + A_L)N_L T \quad (5)$$

Where:

$N_L$ is the number of counts required to trip the comparator 28 when the integrator 24 integrates the combinations $a_L(L)+A_L$ for periods T, $N_4$ is the numbers of times that $a_L(L)$ is integrated during the $N_L$ cycle, and, $N_5$ is the number of times that $A_L$ is integrated during the $N_L$ cycle.

Figure 5:
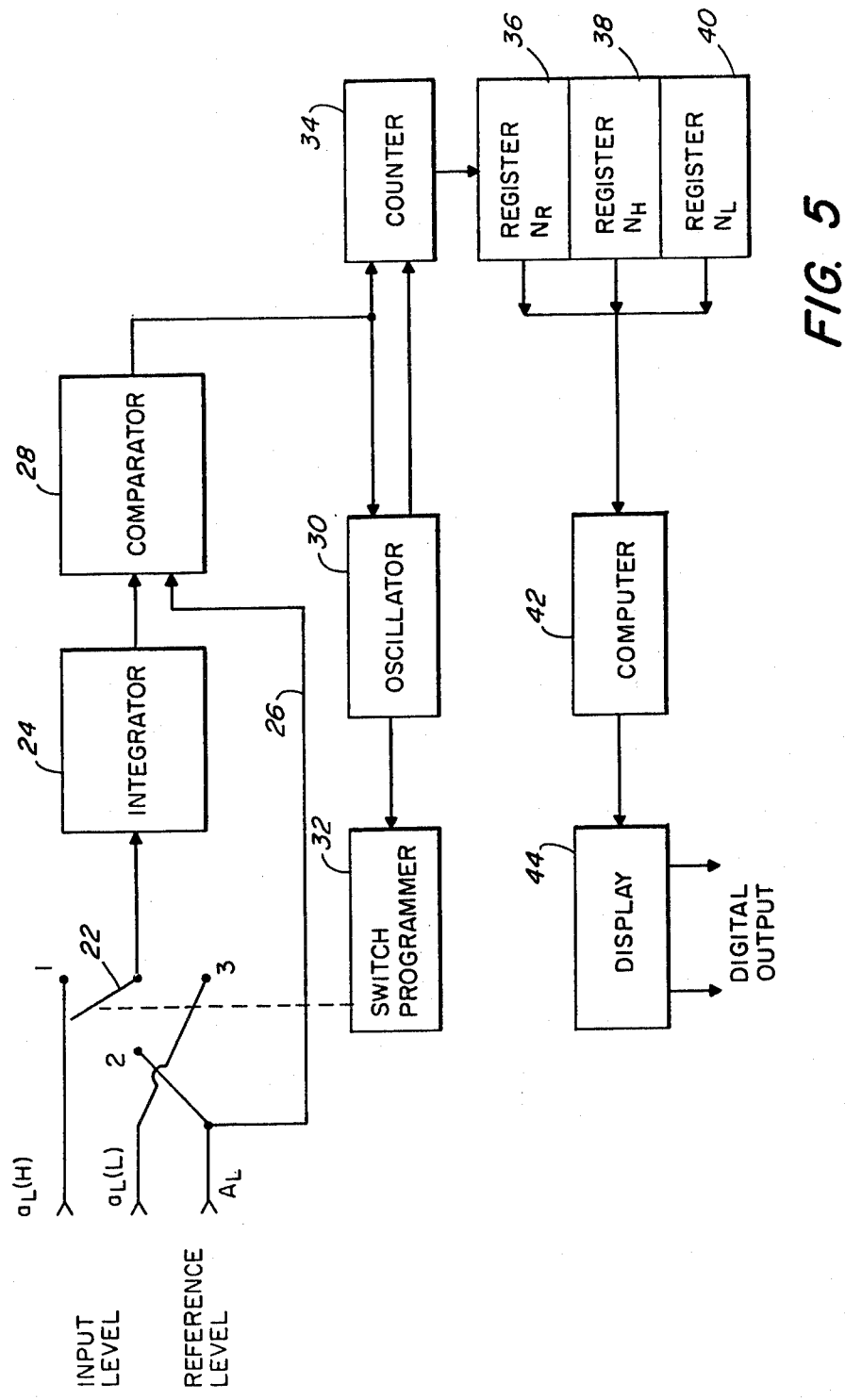
FIG. 5 is a block diagram of a tri-dual phase analog-to-digital converter made according to the invention, and, FIG. 6 is a view similar to FIG. 5 but showing a modification of the invention.

In the above, $a_L(H)$ represents the unknown potential of one of the inputs with respect to a known reference common. $a_L(L)$ represents the unknown potential of the other input with respect to a known reference common. Referring now more particularly to FIG. 5, there is illustrated a block diagram of an analog-to-digital converter adapted to determine and convert the unknown signal level $a_L$. The circuit of FIG. 5 is the same as that of FIG. 3 with the addition of calculating components, and the reference characters of FIG. 3 are repeated in FIG. 5. The circuit includes the three position switch 22 alternately providing inputs to the integrator 24 from two unknown input levels $a_L(H)$ and $a_L(L)$ and one reference level $A_L$. The comparator 28 receives an input from the reference level $A_L$ and functions in the manner described in connection with FIG. 3. The output of the comparator 28 is to an oscillator 30 which, in turn, operates a programmer 32 controlling the switch 22. The oscillator 30 and the comparator 28 also provide inputs to a counter 34, the output of which is to a set of registers 36, 38 and 40 adapted to store counts corresponding to the reference signal and the two unknown signal levels, and indicated respectively as $N_R$, $N_H$ and $N_L$. The counts stored in the registers are fed into a computer 42 adapted to compute the solution in accordance with the above equations once the values of $N_H$ and $N_L$ are determined. The output of the computer is to a display 44 of any desired type with an optional additional digital output as desired. Various digital devices of different types may be used to compute the solution once the values of $N_R$, $N_H$ and $N_L$ are determined.

The particular steps involved in determining and converting the analog value of the unknown signal level $a_L$ is by the following three steps. One: the functions indicated by the formulas (3), (4) and (5) above are first performed using the circuitry of FIG. 5 to produce the counts $N_R$, $N_H$ and $N_L$, where $N_R$ equals the number of counts produced by the reference signal $A_L$, $N_H$ equals the number of counts produced by the unknown signal $a_L(H)$, and $N_L$ equals the number of counts produced by the unknown signal $a_L(L)$. These counts, namely, $N_R$, $N_H$ and $N_L$, are counted by the counter 34 and stored respectively in the registers 36, 38 and 40.

Two: the counts $N_R$, $N_H$ and $N_L$ represent three points along a straight line and $a_L$ may be computed by solving the straight line equations set forth below:

$$A_L = aN_R + b \qquad (6)$$

Where: a=the slope and b=the offset $$a_L(H) = aN_H + b = \text{signal high} \qquad (7)$$

$$a_L(L) = aN_l + b = \text{signal low} \qquad (8)$$

Three: once the counts $N_R$, $N_H$ and $N_L$ are established and stored in the digital registers 36, 38 and 40, the operations required to solve for $a_L = a_L(H) - a_L(L)$ eliminates all of the relative inaccuracies that cannot be eliminated by any other known technique because the manipulations are now performed in a purely digital manner with accuracies that are far in excess of what will be required to derive a desired solution. Also, the technique lends itself ideally to ratiometric measurement considerations where a dynamic range of 10 to 1 is readily achievable.

The system shown in FIG. 5 represents one embodiment of the invention in which the output is in the form of a digital display. Various digital devices are currently available, which may be utilized in computing the solution to the equation once the values of $N_R$, $N_H$ and $N_L$ are determined. Further, the technique may be simplified if the unknown input level low, $a_L(L)$, is considered to be zero with respect to the common of the reference level $A_L$. Using such approach $a_L(H)$ equals $a_L$. The reference signal employed at the input of the converter may be either a fixed internal or external reference source, and the converter may function over a wide range of frequencies, for example, anywhere from 100 cycles to 10 megacycles. The switch 22, in practice, preferably is a solid state switching device such as a field effect transistor programmed to step from one position to another. Insofar as the integrator 24 always integrates to the same level it need not be linear. Since the comparator 28 is always actuated by the same energy input, the sensitivity of the unit is less critical than would be the case in a single slope converter. The circuit configuration is such that the oscillator 30 requires good stability characteristics only over a short term. The switch programmer 32 typically is in the form of a flip-flop adapted to be switched from successive positions for counting one line at a time and then stepping to the next line.

The converter may be used in a wide variety of applications and is particularly suited for small A/D converters such as panel meters, process controllers, etc., in which the input may be from a wide variety of analog values. The converter is characterized by purely digital components after the source provided by a transducer. As a result, very accurate results are obtainable with a simpler and less expensive system than prior art converters. The converter may be made quite small and provided as a module added directly onto a transducer.

The significant part of the technique involves the conversion of the input voltage to a reference level and then to an unknown level (dual phase) in solving for the unknown once the relationship of the reference, the unknown high input, and the unknown low input levels are established.

Figure 6:
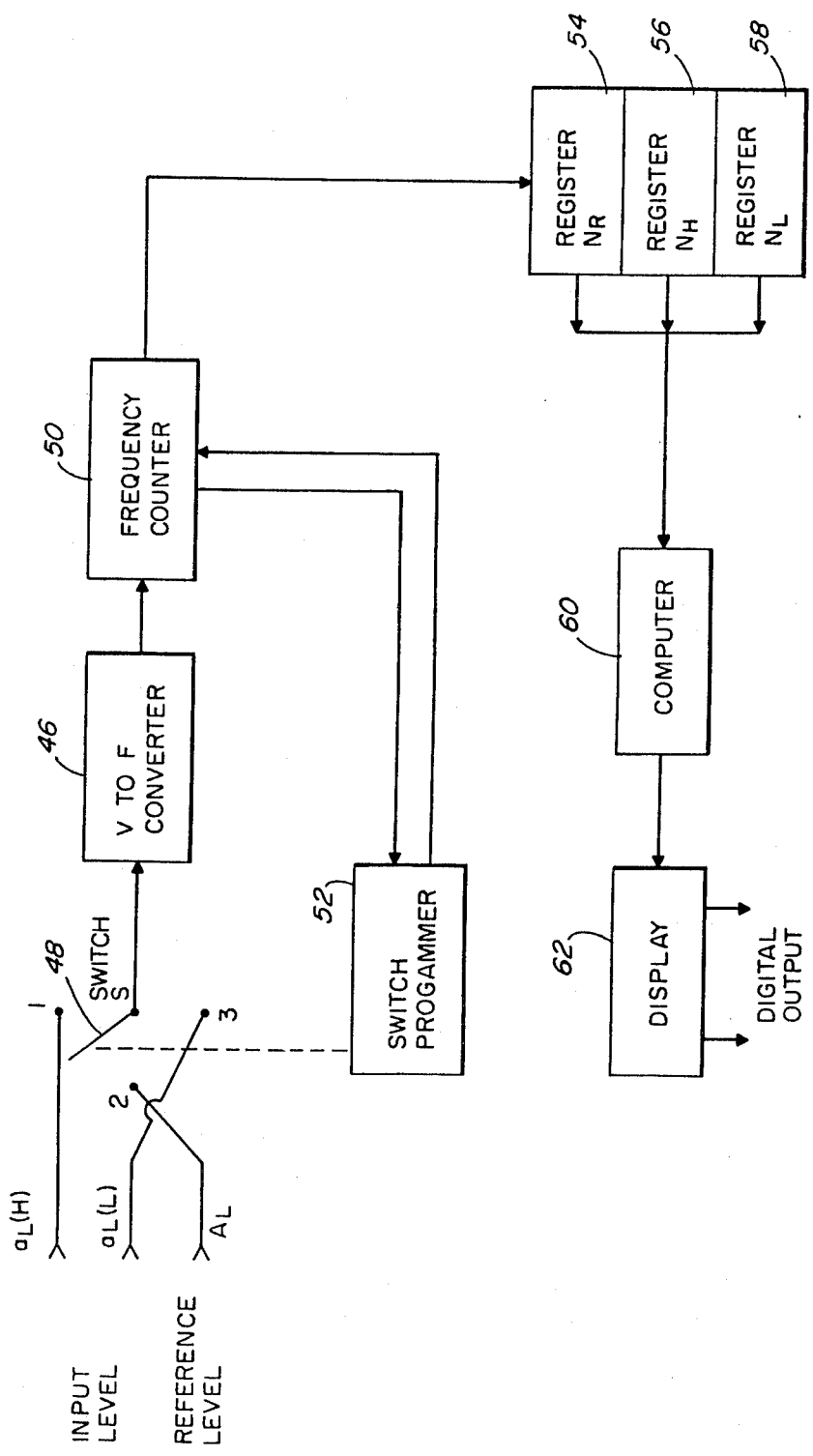

The technique, while shown using an integrator and comparator in FIG. 5, may be carried out by other means as well, and in FIG. 6 there is illustrated in block diagram a system utilizing a voltage-to-frequency converter 46 and performing the same function. In FIG. 6 a switch 48, similar to that of the switch 22, in the principal embodiment, is provided with the same inputs as in FIG. 5. In this embodiment, the voltage-to-frequency converter 46 acts as the integrator, and the frequency output is fed to a frequency counter 50 which acts as the comparator. The primary difference between the FIG. 5 and FIG. 6 embodiments is that the output pulses have a variable width and are measured for a constant time as opposed to a constant width measured for a variable amount of time. In FIG. 6 the frequency counter has an output to a switch programmer 52 operating the switch 48 in a feedback arrangement and also has an output to a set of registers 54, 56 and 58, adapted to store the counts $N_R$, $N_H$ and $N_L$ respectively. The registers feed into a computer 60, adapted to perform the appropriate computations, and the output is to a display 62 or other digital output as desired.

Having thus described the invention, what I claim and desire to obtain by Letters Patent of the United States is:

1. A method of converting an unknown analog electronic signal having high and low levels to a digital electronic signal representing a digital measurement of said unknown analog signal, comprising the steps of:
   (a) electronically combining three different pairs of analog signals, a first pair comprised of the unknown high analog signal and a known reference signal, a second pair comprised of the unknown low analog signal and the known reference signal, and a third pair comprised of the known reference signal and the known reference signal;
   (b) alternately switching electronically each signal of each pair in a predetermined pair sequence to an integrator for equal predetermined time periods;
   (c) electronically comparing the amplitude of each pair for equality with the amplitude of said known reference signal;
   (d) registering a count representing the integration time required to reach amplitude equality for each of said pairs, said counts defining three points on a straight line; and
   (e) electronically generating a digital signal related to the number of counts registered for each said pair, said digital signal representing said unknown analog signal in digital form.

2. A method for converting an unknown analog electronic signal having high and low levels to a digital electronic signal representing a digital measurement of said unknown analog signal, comprising the steps of:
   (a) sequentially sampling said analog electronic signal and generating chopped signals therefrom in predetermined pair combinations, a first pair combination comprised of the high level of the unknown signal and reference signal, a second pair combination comprised of the low level of the unknown signal and the reference signal, and a third pair combination comprised of the reference signal and the reference signal;
   (b) alternately switching electronically each of said signal of each said pair to integrating means for predetermined periods in a predetermined sequence;
   (c) electronically generating an integrated signal for each of said pairs;
   (d) electronically generating an output pulse when the amplitude of said integrated signal for each pair equals said reference signal;
   (e) electronically generating a series of clock pulses;
   (f) counting and storing the number of clock pulses generated during the integration period for each said pair; and
   (g) electronically processing said stored counts and electronically generating a digital signal representing said unknown analog signal in digital form.

* * * * *